United States Patent
Li et al.

(10) Patent No.: US 11,051,331 B2
(45) Date of Patent: Jun. 29, 2021

(54) TECHNIQUES AND APPARATUSES FOR PAIRED PHYSICAL DOWNLINK SHARED CHANNEL AND PHYSICAL UPLINK SHARED CHANNEL SCHEDULING

(71) Applicant: QUALCOMM Incorporated, San Diego, CA (US)

(72) Inventors: Junyi Li, Chester, NJ (US); Durga Prasad Malladi, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 87 days.

(21) Appl. No.: 15/977,801

(22) Filed: May 11, 2018

(65) Prior Publication Data

US 2019/0349980 A1 Nov. 14, 2019

(51) Int. Cl.
  *H04W 72/14* (2009.01)
  *H04W 72/12* (2009.01)
  *H03M 13/09* (2006.01)

(52) U.S. Cl.
  CPC .......... *H04W 72/14* (2013.01); *H03M 13/09* (2013.01); *H04W 72/1268* (2013.01); *H04W 72/1273* (2013.01)

(58) Field of Classification Search
  None
  See application file for complete search history.

(56) References Cited

U.S. PATENT DOCUMENTS

| 9,769,820 B2 | 9/2017 | Seo et al. |
| 9,894,644 B2 | 2/2018 | Kang et al. |
| 2011/0292917 A1* | 12/2011 | Fan .................. H04L 5/0023 370/336 |
| 2014/0126485 A1 | 5/2014 | Chen et al. |
| 2017/0171841 A1 | 6/2017 | Chen et al. |
| 2017/0290008 A1* | 10/2017 | Tooher ................. H04L 1/0007 |

(Continued)

FOREIGN PATENT DOCUMENTS

| WO | 2009042158 A2 | 4/2009 |
| WO | 2013023684 A1 | 2/2013 |
| WO | WO-2016123393 A1 * | 8/2016 ........... H04L 5/0053 |

OTHER PUBLICATIONS

International Search Report and Written Opinion—PCT/US2019/029872—ISA/EPO—dated Jun. 19, 2019.

(Continued)

*Primary Examiner* — Peter Chen
*Assistant Examiner* — Jeff Banthrongsack
(74) *Attorney, Agent, or Firm* — Kevin T. Cheatham

(57) ABSTRACT

Various aspects of the present disclosure generally relate to wireless communication. In some aspects, a wireless communication device may receive a paired scheduling assignment including a physical downlink shared channel (PDSCH) scheduling assignment for a PDSCH communication, wherein the paired scheduling assignment is based at least in part on a timing relationship between PDSCH communications, associated with the wireless communication device, and physical uplink shared channel (PUSCH) communications associated with the wireless communication device; and determine, based at least in part on the paired scheduling assignment, a PUSCH scheduling assignment for a PUSCH communication. Numerous other aspects are provided.

30 Claims, 8 Drawing Sheets

(56) References Cited

U.S. PATENT DOCUMENTS

2018/0279360 A1* 9/2018 Park ..................... H04L 5/0053

OTHER PUBLICATIONS

LG Electronics: "Discussion on Compact DCI Format Design", 3GPP Draft; R1-1804570 Discussion on Compact DCI Format Design, 3rd Generation Partnership Project (3GPP), Mobile Competence Centre, 650, Route Des Lucioles ; F-06921 Sophia-Antipolis Cedex, France, vol. RAN WG1, No. Sanya, China; Apr. 16, 2018-Apr. 20, 2018, Apr. 15, 2018 (Apr. 15, 2018), 6 Pgs, XP051426839, Retrieved from the Internet: URL: http://www.3gpp.org/ftp/Meetings_3GPP_SYNC/RAN1/Docs/ [retrieved on Apr. 15, 2018], Paragraph 3.1.

* cited by examiner

TECHNIQUES AND APPARATUSES FOR PAIRED PHYSICAL DOWNLINK SHARED CHANNEL AND PHYSICAL UPLINK SHARED CHANNEL SCHEDULING

TECHNICAL FIELD OF THE DISCLOSURE

Aspects of the technology described below generally relate to wireless communication, and more particularly to techniques and apparatuses for paired physical downlink shared channel (PDSCH) and physical uplink shared channel (PUSCH) scheduling. Some techniques and apparatuses described herein enable and provide wireless communication devices and systems configured for reducing scheduling overhead.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a new radio (NR) BS, a 5G Node B, and/or the like.

The above multiple access technologies have been adopted in various telecommunication standards to provide a common protocol that enables different user equipment to communicate on a municipal, national, regional, and even global level. New radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

BRIEF SUMMARY OF SOME EXAMPLES

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. The sole purpose of this summary is to present some concepts of one or more aspects of the disclosure in summary form as a prelude to the more detailed description that is presented later.

In some aspects, a method of wireless communication, performed by a wireless communication device, may include receiving a paired scheduling assignment including a PDSCH scheduling assignment for a PDSCH communication, wherein the paired scheduling assignment is based at least in part on a timing relationship between PDSCH communications, associated with the wireless communication device, and PUSCH communications associated with the wireless communication device; and determining, based at least in part on the paired scheduling assignment, a PUSCH scheduling assignment for a PUSCH communication.

In some aspects, a wireless communication device for wireless communication may include memory and one or more processors operatively coupled to the memory. The memory and the one or more processors may be configured to receive a paired scheduling assignment including a PDSCH scheduling assignment for a PDSCH communication, wherein the paired scheduling assignment is based at least in part on a timing relationship between PDSCH communications, associated with the wireless communication device, and PUSCH communications associated with the wireless communication device; and determine, based at least in part on the paired scheduling assignment, a PUSCH scheduling assignment for a PUSCH communication.

In some aspects, a non-transitory computer-readable medium may store one or more instructions for wireless communication. The one or more instructions, when executed by one or more processors of a wireless communication device, may cause the one or more processors to receive a paired scheduling assignment including a PDSCH scheduling assignment for a PDSCH communication, wherein the paired scheduling assignment is based at least in part on a timing relationship between PDSCH communications, associated with the wireless communication device, and PUSCH communications associated with the wireless communication device; and determine, based at least in part on the paired scheduling assignment, a PUSCH scheduling assignment for a PUSCH communication.

In some aspects, an apparatus for wireless communication may include means for receiving a paired scheduling assignment including a PDSCH scheduling assignment for a PDSCH communication, wherein the paired scheduling assignment is based at least in part on a timing relationship between PDSCH communications, associated with the apparatus, and PUSCH communications associated with the apparatus; and means for determining, based at least in part on the paired scheduling assignment, a PUSCH scheduling assignment for a PUSCH communication.

In some aspects, a method of wireless communication, performed by a wireless communication device, may include generating a paired scheduling assignment including a PDSCH scheduling assignment for a PDSCH communication, wherein the paired scheduling assignment is generated based at least in part on a timing relationship between PDSCH communications, associated with the wireless communication device, and PUSCH communications associated with the wireless communication device, and wherein a PUSCH scheduling assignment, associated with a PUSCH communication, is to be determined based at least in part on the paired scheduling assignment; and providing the paired scheduling assignment.

In some aspects, a wireless communication device for wireless communication may include memory and one or more processors operatively coupled to the memory. The memory and the one or more processors may be configured to generate a paired scheduling assignment including a PDSCH scheduling assignment for a PDSCH communication, wherein the paired scheduling assignment is generated based at least in part on a timing relationship between PDSCH communications, associated with the wireless communication device, and PUSCH communications associated with the wireless communication device, and wherein a PUSCH scheduling assignment, associated with a PUSCH communication, is to be determined based at least in part on the paired scheduling assignment; and provide the paired scheduling assignment.

In some aspects, a non-transitory computer-readable medium may store one or more instructions for wireless communication. The one or more instructions, when executed by one or more processors of a wireless communication device, may cause the one or more processors to generate a paired scheduling assignment including a PDSCH scheduling assignment for a PDSCH communication, wherein the paired scheduling assignment is generated based at least in part on a timing relationship between PDSCH communications, associated with the wireless communication device, and PUSCH communications associated with the wireless communication device, and wherein a PUSCH scheduling assignment, associated with a PUSCH communication, is to be determined based at least in part on the paired scheduling assignment; and provide the paired scheduling assignment.

In some aspects, an apparatus for wireless communication may include means for generating a paired scheduling assignment including a PDSCH scheduling assignment for a PDSCH communication, wherein the paired scheduling assignment is generated based at least in part on a timing relationship between PDSCH communications, associated with the apparatus, and PUSCH communications associated with the apparatus, and wherein a PUSCH scheduling assignment, associated with a PUSCH communication, is to be determined based at least in part on the paired scheduling assignment; and means for providing the paired scheduling assignment.

Aspects generally include a method, apparatus, system, computer program product, non-transitory computer-readable medium, user equipment, base station, wireless communication device, sensor, actuator, controller, and processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
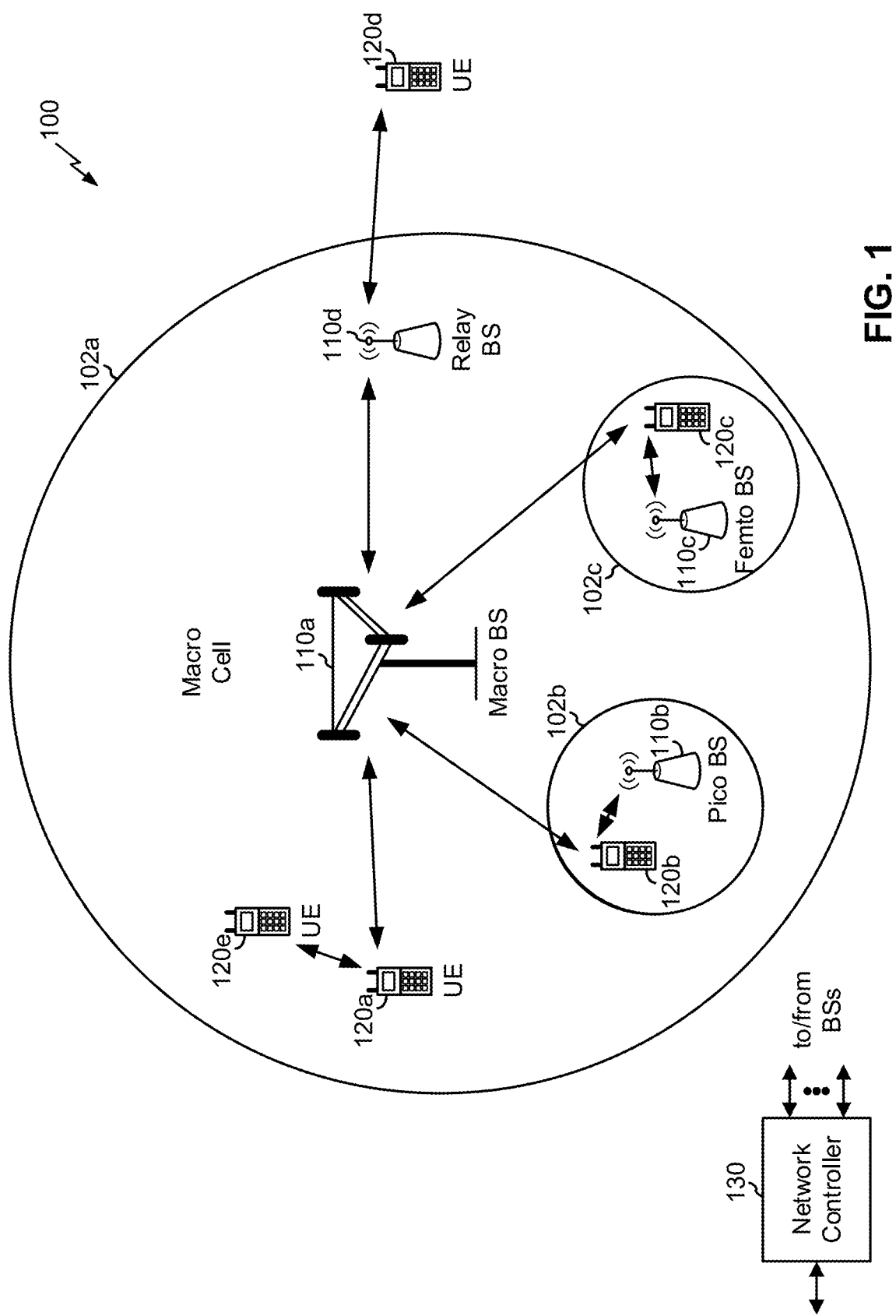
FIG. 1 is a block diagram conceptually illustrating an example of a wireless communication network, in accordance with various aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It is noted that while aspects may be described herein using terminology commonly associated with 3G and/or 4G wireless technologies, aspects of the present disclosure can be applied in other generation-based communication systems, such as 5G and later, including NR technologies.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and/or other non-module-component based devices (e.g., end-user devices, vehicles, communication devices, computing devices, industrial equipment, retail/purchasing devices, medical devices, AI-enabled devices, and/or the like). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including one or more antennas, RF-chains, power amplifiers, modulators, buffers, processors, interleavers, adders/summers, and/or the like). It is intended that innovations described herein may be practiced in a wide variety of devices, chip-level components, systems, distributed arrangements, end-user devices, etc. of varying sizes, shapes, and constitution.

FIG. 1 is a diagram illustrating a network 100 in which aspects of the present disclosure may be practiced. The network 100 may be an LTE network or some other wireless network, such as a 5G or NR network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the access network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impact on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, such as sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided merely as an example. Other examples are possible and may differ from what was described with regard to FIG. 1.

Figure 2:
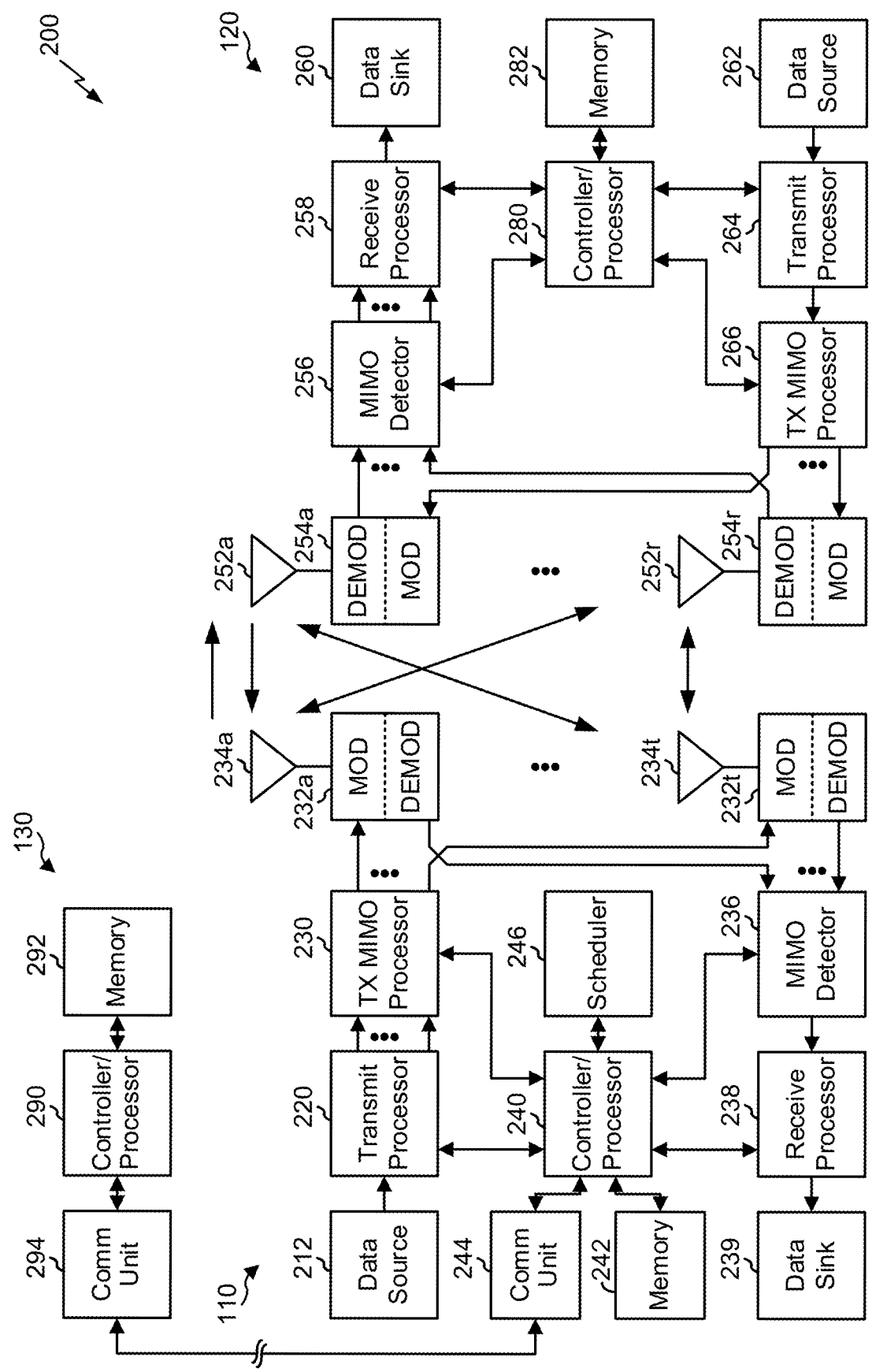
FIG. 2 is a block diagram conceptually illustrating an example of a base station in communication with a user equipment (UE) in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

In some aspects, one or more components of UE 120 may be included in a housing. Controller/processor 240 of base station 110, controller/processor 280 of UE 120, and/or any other component(s) of FIG. 2 may perform one or more techniques associated with paired PDSCH and PUSCH scheduling, as described in more detail elsewhere herein. For example, controller/processor 240 of base station 110, controller/processor 280 of UE 120, and/or any other component(s) of FIG. 2 may perform or direct operations of, for example, process 700 of FIG. 7 and/or other processes as described herein. Memories 242 and 282 may store data and program codes for base station 110 and UE 120, respectively. A scheduler 246 may schedule UEs for data transmission on the downlink and/or uplink.

In some aspects, a wireless communication device (e.g., base station 110, UE 120, and/or the like) may include means for receiving a paired scheduling assignment including a PDSCH scheduling assignment for a PDSCH communication, wherein the paired scheduling assignment is based at least in part on a timing relationship between PDSCH communications, associated with the wireless communication device, and PUSCH communications associated with the wireless communication device; means for determining, based at least in part on the paired scheduling assignment, a PUSCH scheduling assignment for a PUSCH communication; and/or the like. In some aspects, such means may include one or more components of UE 120 or base station 110 described in connection with FIG. 2.

In some aspects, a wireless communication device (e.g., base station 110, UE 120, and/or the like) may include means for generating a paired scheduling assignment including a PDSCH scheduling assignment for a PDSCH communication, wherein the paired scheduling assignment is based at least in part on a timing relationship between PDSCH communications, associated with the wireless communication device, and PUSCH communications associated with the wireless communication device, and wherein a PUSCH scheduling assignment, associated with a PUSCH communication, is to be determined based at least in part on the paired scheduling assignment; means for providing the paired scheduling assignment; and/or the like. In some aspects, such means may include one or more components of UE 120 or base station 110 described in connection with FIG. 2.

As indicated above, FIG. 2 is provided merely as an example. Other examples are possible and may differ from what was described with regard to FIG. 2.

Figure 3:
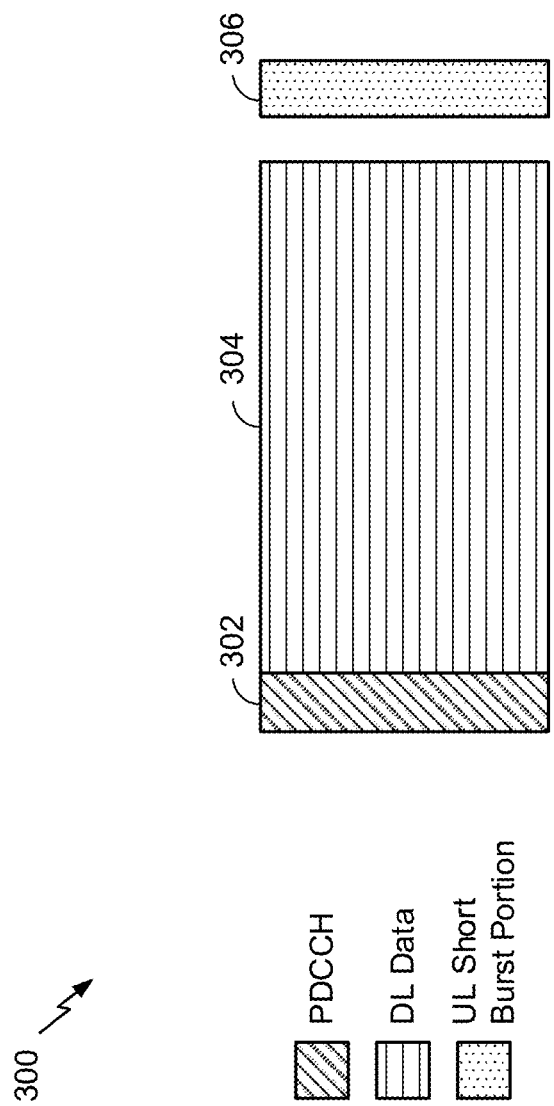
FIG. 3 is a diagram illustrating an example of a downlink (DL)-centric slot, in accordance with various aspects of the present disclosure.

FIG. 3 is a diagram 300 showing an example of a DL-centric slot or wireless communication structure. The DL-centric slot may include a control portion 302. The control portion 302 may exist in the initial or beginning portion of the DL-centric slot. The control portion 302 may include various scheduling information and/or control information corresponding to various portions of the DL-centric slot. In some configurations, the control portion 302 may be a physical DL control channel (PDCCH), as indicated in FIG. 3. In some aspects, the control portion 302 may include legacy PDCCH information, shortened PDCCH (sPDCCH) information), a control format indicator (CFI) value (e.g., carried on a physical control format indicator channel (PC-FICH)), one or more grants (e.g., downlink grants, uplink grants, and/or the like), and/or the like.

The DL-centric slot may also include a DL data portion 304. The DL data portion 304 may sometimes be referred to as the payload of the DL-centric slot. The DL data portion 304 may include the communication resources utilized to communicate DL data from the scheduling entity (e.g., UE or BS) to the subordinate entity (e.g., UE). In some configurations, the DL data portion 304 may be a physical DL shared channel (PDSCH).

The DL-centric slot may also include an UL short burst portion 306. The UL short burst portion 306 may sometimes be referred to as an UL burst, an UL burst portion, a common UL burst, a short burst, an UL short burst, a common UL short burst, a common UL short burst portion, and/or various other suitable terms. In some aspects, the UL short burst portion 306 may include one or more reference signals. Additionally, or alternatively, the UL short burst portion 306 may include feedback information corresponding to various other portions of the DL-centric slot. For example, the UL short burst portion 306 may include feedback information corresponding to the control portion 302 and/or the data portion 304. Non-limiting examples of information that may be included in the UL short burst portion 306 include an ACK signal (e.g., a PUCCH ACK, a PUSCH ACK, an immediate ACK), a NACK signal (e.g., a PUCCH NACK, a PUSCH NACK, an immediate NACK), a scheduling request (SR), a buffer status report (BSR), a HARQ indicator, a channel state indication (CSI), a channel quality indicator (CQI), a sounding reference signal (SRS), a demodulation reference signal (DMRS), PUSCH data, and/or various other suitable types of information. The UL short burst portion 306 may include additional or alternative information, such as information pertaining to random access channel (RACH) procedures, scheduling requests, and various other suitable types of information.

As illustrated in FIG. 3, the end of the DL data portion 304 may be separated in time from the beginning of the UL short burst portion 306. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). The foregoing is merely one example of a DL-centric wireless communication structure, and alternative structures having similar features may exist without necessarily deviating from the aspects described herein.

As indicated above, FIG. 3 is provided merely as an example. Other examples are possible and may differ from what was described with regard to FIG. 3.

Figure 4:
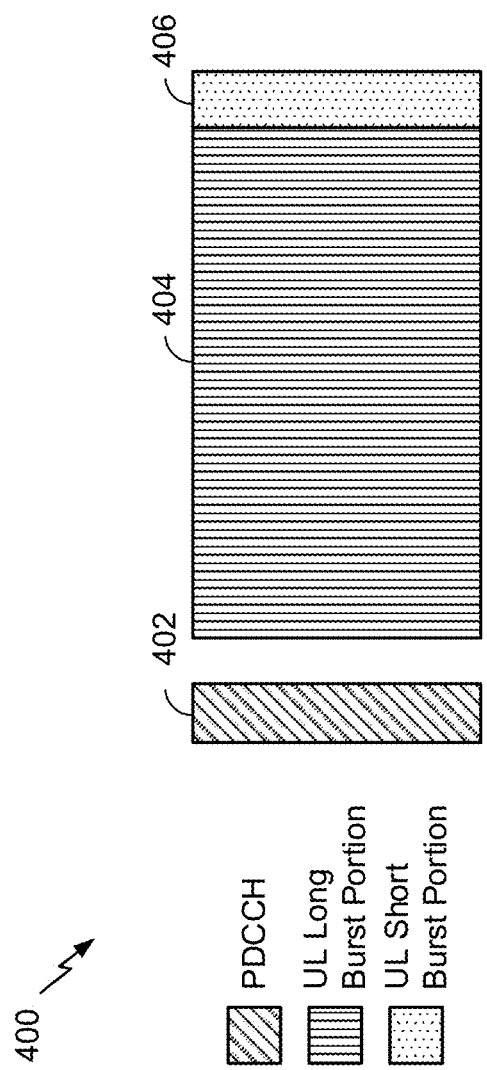
FIG. 4 is a diagram illustrating an example of an uplink (UL)-centric slot, in accordance with various aspects of the present disclosure.

FIG. 4 is a diagram 400 showing an example of an UL-centric slot or wireless communication structure. The UL-centric slot may include a control portion 402. The control portion 402 may exist in the initial or beginning portion of the UL-centric slot. The control portion 402 in FIG. 4 may be similar to the control portion 302 described above with reference to FIG. 3. The UL-centric slot may also include an UL long burst portion 404. The UL long burst portion 404 may sometimes be referred to as the payload of the UL-centric slot. The UL portion may refer to the communication resources utilized to communicate UL data from the subordinate entity (e.g., UE) to the scheduling entity (e.g., UE or BS). In some configurations, the control portion 402 may be a physical DL control channel (PDCCH).

As illustrated in FIG. 4, the end of the control portion 402 may be separated in time from the beginning of the UL long burst portion 404. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity).

The UL-centric slot may also include an UL short burst portion 406. The UL short burst portion 406 in FIG. 4 may be similar to the UL short burst portion 306 described above with reference to FIG. 3, and may include any of the information described above in connection with FIG. 3. The foregoing is merely one example of an UL-centric wireless communication structure, and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some aspects, the sidelink signals may be communicated using a licensed spectrum (unlike wireless local area networks, which typically use an unlicensed spectrum).

In one example, a wireless communication structure, such as a frame, may include both UL-centric slots and DL-centric slots. In this example, the ratio of UL-centric slots to DL-centric slots in a frame may be dynamically adjusted based at least in part on the amount of UL data and the amount of DL data that are transmitted. For example, if there is more UL data, then the ratio of UL-centric slots to DL-centric slots may be increased. Conversely, if there is more DL data, then the ratio of UL-centric slots to DL-centric slots may be decreased.

As indicated above, FIG. 4 is provided merely as an example. Other examples are possible and may differ from what was described with regard to FIG. 4.

Industrial IoT (IIoT) is a branch of cellular technology in which UEs and base stations are used to carry control data, measurement data, and/or the like between various industrial systems. For example, IIoT may be used to control sensors and/or actuators, to exchange measurement information between programmable logic controllers (PLCs) of a factory floor (e.g., in a factory automation application), and/or the like. In many applications, this traffic is treated as ultra-reliable low-latency communication (URLLC) traffic, which imparts strict latency and reliability requirements. Thus, as a number of devices (e.g., sensors, actuators, PLCs, and/or the like) in a given IIOT application increases, an amount of control overhead may need to be reduced as much as possible (e.g., in order to allow the latency and/or reliability requirements to be satisfied).

Importantly, in such applications, a significant portion of the traffic may be periodic, with deterministic synchronous cycles. Furthermore, downlink communications (e.g., from a PLC to a sensor/actuator) and uplink communications (e.g., from a sensor/actuator to a PLC) are often symmetric and paired. These attributes present an opportunity to reduce scheduling overhead.

Some techniques and apparatuses described herein provide paired PDSCH and PUSCH scheduling. In some aspects, paired PDSCH and PUSCH scheduling may be achieved using a paired scheduling assignment, where the paired scheduling assignment is based at least in part on a timing relationship between PDSCH communications and PUSCH communications of a given wireless communication device. In some aspects, the paired scheduling assignment may include a PDSCH scheduling assignment (for an upcoming PDSCH communication), and the wireless communication device may determine a PUSCH scheduling assignment (for an upcoming PUSCH communication) based at least in part on the paired scheduling assignment, as described in further detail below.

In some aspects, paired PDSCH and PUSCH scheduling reduces an amount of control overhead (e.g., PDCCH scheduling overhead) needed to schedule a pair of PDSCH and PUSCH communications, as described in further detail below. Thus, paired PDSCH and PUSCH scheduling may allow latency and/or reliability traffic requirements to be more readily satisfied.

Figure 5:
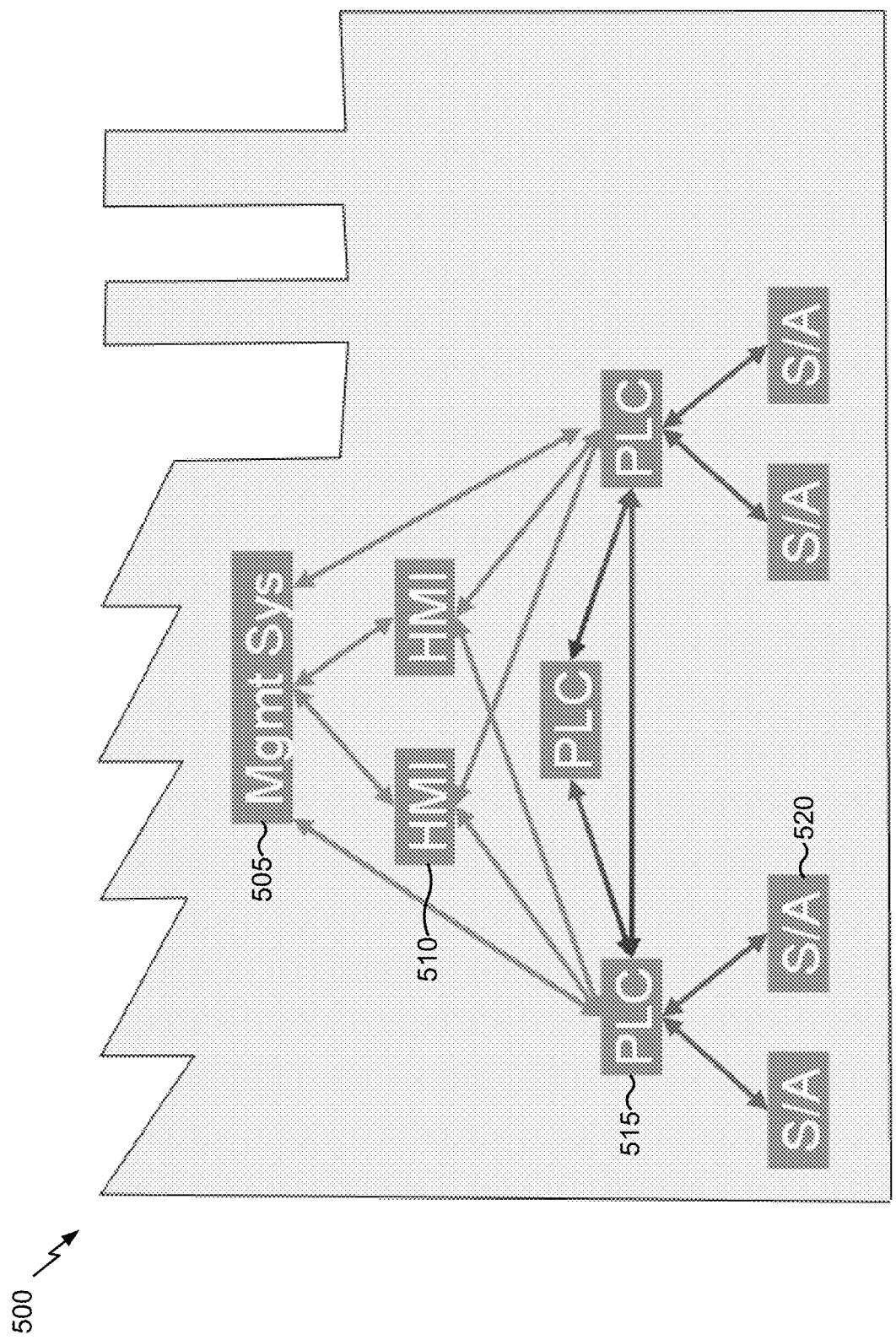
FIG. 5 is a diagram illustrating an example of an Industrial Internet of Things (IIOT) deployment, in accordance with various aspects of the present disclosure.

FIG. 5 is a diagram illustrating an example of an IIoT deployment 500, in accordance with various aspects of the present disclosure. As shown, IIoT deployment 500 includes a management system 505, one or more human-machine interfaces (HMIs) 510, one or more programmable logic circuits (PLCs) 515, and one or more sensor/actuators (S/As) 520.

Management system 505 may include a computer, such as an industrial personal computer, network controller 130, and/or the like. Management system 505 may perform controller programming, software and security management, long-term key performance indicator (KPI) monitoring, and/or the like. In some aspects, management system 505 may perform one or more of the operations described herein as being performed by network controller 130.

HMI 510 includes a user device, such as a tablet computer, a laptop computer, a wearable device (e.g., a smart wristwatch, smart eyeglasses, etc.), a mobile phone, a virtual reality device, an augmented reality device, and/or the like. HMI 510 may provide for control of machines (e.g., S/A 520) at a factory-floor level. In some aspects, HMI 510 may provide for changing an operational mode of an S/A 520.

PLC 515 includes a processor (e.g., a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component). PLC 515 may be associated with a BS 110 that communicates with S/A 520 using uplink/downlink communications. In some aspects, PLC 515 may be associated with a UE 120 that communicates with S/A 520 using sidelink communications. In some aspects, PLC 515 may issue commands and receive sensor inputs in real-time or near real-time from S/A 520. In some aspects, PLCs 515 and management system 505 may be associated with a backhaul, such as a wireless or wireline backhaul.

S/A 520 a sensor, an actuator, and/or another type of IIOT device. For example, S/A 520 may be a sensor or actuator, such as a rotary motor, a linear servo, a position sensor, and/or the like. In some aspects, S/A 520 may include a UE (e.g., UE 120), may be included in a UE, or may be associated with a UE (e.g., such that S/A 520 communicates with UE 120 using sidelink communications). In some aspects, S/A 520 may be associated with a radio interface via which to communicate with a given PLC 515. The radio interface may be scheduled by a BS 110 associated with PLC 515 and/or configured based at least in part on configuration information provided by management system 505. In some aspects, the radio interface may carry scheduling information (e.g., a paired scheduling assignment) associated with URLLC communications between S/A 520 and PLC 515, and/or may carry the URLLC communications themselves.

As indicated above, FIG. 5 is provided as an example. Other examples are possible and may differ from what was described with respect to FIG. 5.

Figure 6A:
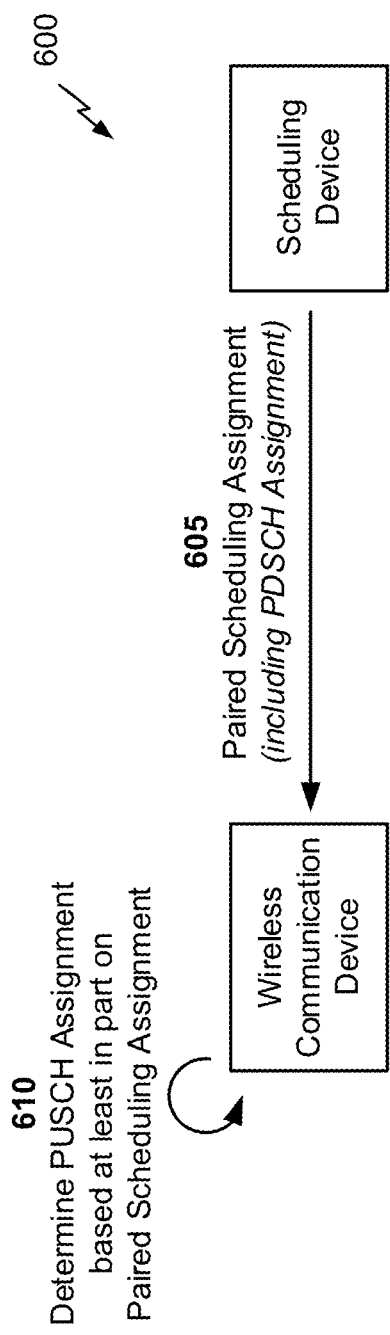
FIGS. 6A and 6B are diagrams illustrating an example of paired PDSCH and PUSCH scheduling, in accordance with various aspects of the present disclosure.
Figure 6B:
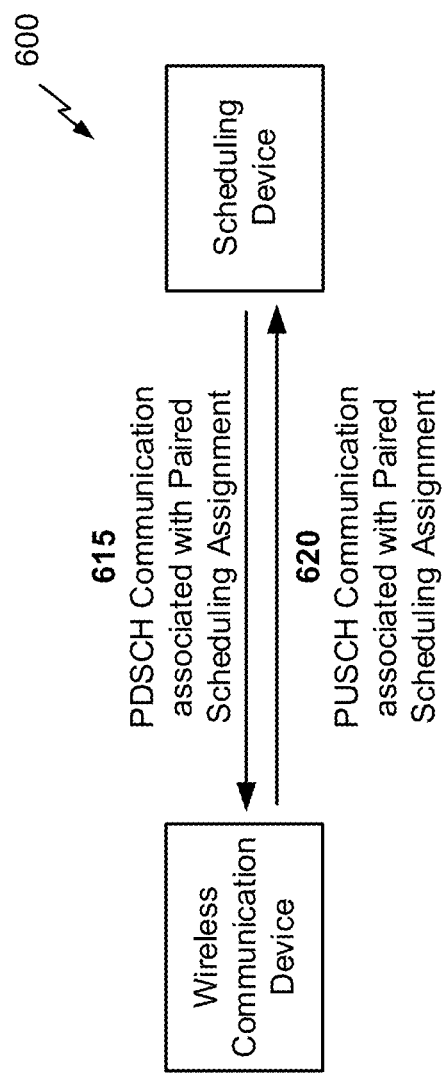

FIGS. 6A and 6B are diagrams illustrating an example 600 of paired PDSCH and PUSCH scheduling, in accordance with various aspects of the present disclosure. The operations shown in FIGS. 6A and 6B are described as being performed by a wireless communication device, such as UE 120 and/or an associated S/A 520.

As shown in FIG. 6A, and by reference number 605, the wireless communication device may receive, from a scheduling device (e.g., another wireless communication device, such as BS 110 and/or an associated PLC 515), a paired scheduling assignment. The paired scheduling assignment includes information associated with scheduling a PDSCH communication (e.g., a URLLC communication that is to be received by the wireless communication device) and a PUSCH communication (e.g., a URLLC communication that is to be transmitted by the wireless communication device). Generally, the paired scheduling assignment includes information associated with scheduling at least two communications for receipt and/or transmission by the wireless communication device (e.g., one or more PDSCH communications and one or more PUSCH communications). In some aspects, the wireless communication device may receive the paired scheduling assignment in a physical downlink control channel (PDCCH). In some aspects, the scheduling device may generate the paired scheduling assignment.

In some aspects, the paired scheduling assignment may include a PDSCH scheduling assignment for a PDSCH communication (e.g., an upcoming URLLC communication that is to be received by the wireless communication device). For example, the paired scheduling assignment may include information that identifies a set of downlink resources (e.g., one or more physical resource blocks (PRBs)) in which the wireless communication device may expect to receive the PDSCH communication, information that identifies a modulation and coding scheme (MCS) associated with the PDSCH communication, and/or the like.

In some aspects, the wireless communication device may determine a PUSCH scheduling assignment for a PUSCH communication (e.g., an upcoming URLLC communication that is to be transmitted by the wireless communication device) based at least in part on the paired scheduling assignment, as described in further detail below.

In some aspects, the paired scheduling assignment may be based at least in part on a timing relationship between PDSCH communications, associated with the wireless communication device, and PUSCH communications associated with the wireless communication device. The timing relationship may identify a time-based relationship associated with PDSCH and PUSCH communications associated with the wireless communication device. For example, the timing relationship may indicate that the wireless communication device regularly transmits one PUSCH communication a particular amount of time after the wireless communication device receives a PDSCH communication. As another example, the timing relationship may indicate that the wireless communication device regularly transmits a first PUSCH communication a first particular amount of time after the wireless communication device receives a PDSCH communication, and transmits a second PUSCH communication a second particular amount of time after transmitting the first PUSCH communication. In some aspects, the timing relationship may identify an amount of time between a given PDSCH and PUSCH communication pair (e.g., an average amount of time, a minimum amount of time, and/or the like).

Such a timing relationship may be typical in some applications, such as an IIOT application, or another type of application in which wireless communication device traffic is periodic, with a deterministic synchronous cycle, and PDSCH communications and PUSCH communications are symmetric and paired.

In some aspects, the paired scheduling assignment may be configured based at least in part on the timing relationship. For example, the paired scheduling assignment may include a PDSCH scheduling assignment (e.g., information that identifies a set of downlink resources) associated with a PUSCH communication, and may allow the wireless communication device to determine a PUSCH scheduling assignment (e.g., information that identifies a set of uplink resources) for transmitting a PUSCH communication, as described in further detail below.

In some aspects, the timing relationship may be identified by the wireless communication device (e.g., based at least in part on monitoring timing of PDSCH and PUSCH communications). In such a case, the wireless communication device may provide, to the scheduling device (e.g., BS 110, an associated PLC 515), information associated with the timing relationship (e.g., based at least in part on a request from the scheduling device, on a periodic basis, and/or the like). In some aspects, information indicative of the timing relationship may be communicated (e.g., from the wireless communication device to the scheduling device) prior to radio resource control (RRC) signaling based on which the wireless communication device is configured with a timing offset, as described below.

Additionally, or alternatively, the scheduling device may identify the timing relationship (e.g., based at least in part on monitoring timing of PDSCH and PUSCH communications associated with the wireless communication device and/or one or more other wireless communication devices). In other words, in some aspects, the scheduling device may determine the information indicative of the timing relationship.

As further shown in FIG. 6A, and by reference number 610, the wireless communication device may determine a PUSCH scheduling assignment based at least in part on the paired scheduling assignment.

In some aspects, the wireless communication device may determine the PUSCH scheduling assignment based at least in part on the PUSCH scheduling assignment being included in the paired scheduling assignment. For example, the paired scheduling assignment may include a first set of bits that carry the PDSCH scheduling assignment, and a second set of bits that carry the PUSCH scheduling assignment. In such a case, the PDSCH scheduling assignment and the PUSCH scheduling assignment may share a set of cyclic redundancy check (CRC) bits included in the paired scheduling assignment, in some aspects. As such, the paired scheduling assignment may reduce control overhead (e.g., since the PDSCH scheduling assignment and the PUSCH scheduling assignment do not require separate CRC bits, which can comprise a significant portion of a given transmission).

In some aspects, the wireless communication device may determine the PUSCH scheduling assignment based at least in part on a timing offset associated with the PDSCH scheduling assignment. For example, the wireless communication device may receive the paired scheduling assignment including the PDSCH scheduling assignment, and may determine, based at least in part on the PDSCH scheduling assignment and the timing offset, the PUSCH scheduling assignment. Here, the timing offset may identify an amount of time between a set of resources associated with the PDSCH communication and a set of resources associated with the PUSCH communication. In some aspects, the wireless communication device may be configured with the timing offset via radio resource control (RRC) signaling.

In some aspects, the wireless communication device may determine the PUSCH scheduling assignment based at least in part on a predetermined relationship associated with the PDSCH scheduling assignment.

For example, the wireless communication device may determine the PUSCH scheduling assignment based at least in part on identifying a set of uplink resources, associated with the PUSCH scheduling assignment, based at least in part on a set of downlink resources identified by the PDSCH scheduling assignment. Here, the wireless communication device may be configured with information associating the set of uplink resources and the set of downlink resources such that, upon receiving a paired scheduling assignment including a PDSCH scheduling assignment that identifies the set of downlink resources, the wireless communication device may determine a PUSCH scheduling assignment that identifies the set of uplink resources. In some aspects, the wireless communication device may be configured with information associating the set of downlink resources and the set of uplink resources via RRC signaling. In some aspects, the wireless communication device may be configured with information associating two or more sets of uplink resources with a given set of downlink resources. In such a case, the wireless communication device, upon receiving a PDSCH scheduling assignment identifying the set of downlink resources, may select one of the two or more sets of uplink resources for transmitting the PUSCH communication.

As another example, the wireless communication device may determine the PUSCH scheduling assignment based at least in part on identifying a modulation and coding scheme (MCS) associated with the PUSCH communication (herein referred to as a PUSCH MCS) based at least in part on a MCS associated with the PDSCH communication (herein referred to as a PDSCH MCS). Here, the wireless communication device may be configured with information associating the PUSCH MCS and the PDSCH MCS and, upon receiving a paired scheduling assignment including a PDSCH scheduling assignment that identifies the PDSCH MCS, the wireless communication device may determine a PUSCH scheduling assignment that identifies the PUSCH MCS. In some aspects, the wireless communication device may be configured with information associating the PDSCH MCS and the PUSCH MCS via RRC signaling. The information associating the PDSCH MCS and the PUSCH MCS may indicate, for example, that the PUSCH communication is to use the same modulation scheme as the PDSCH communication and, if the PDSCH coding rate is a particular rate (e.g., ⅓), that the PUSCH coding rate should be one of a set of coding rates (e.g., ¼, ⅓, ½, and/or the like).

As shown in FIG. 6B, and by reference number 615, the wireless communication device may receive the PDSCH communication associated with the paired scheduling assignment (e.g., based at least in part on receiving the PDSCH scheduling assignment in the paired scheduling assignment). As shown by reference number 620, the wireless communication device may then transmit the PUSCH communication associated with the paired scheduling assignment (e.g., based at least in part on determining the PUSCH scheduling assignment).

Notably, in the above examples, control overhead associated with scheduling PDSCH and PUSCH communications is reduced (e.g., since separate PDSCH and PUSCH scheduling assignments are not needed), thereby conserving network resources such that latency and/or reliability traffic requirements can be more readily satisfied.

Further, while the above examples are described in the context of a paired scheduling assignment associated with a single PDSCH communication and a single PUSCH communication, other implementations are possible. For example, in some aspects, the paired scheduling assignment may include a first PDSCH scheduling assignment associated with a first PDSCH communication, and the wireless communication device may determine a PUSCH scheduling assignment, associated with a PUSCH communication, and a second PDSCH scheduling assignment, associated with a second PDSCH communication, based at least in part on the paired scheduling assignment, in a similar manner to that described above.

As another example, in some aspects, the paired scheduling assignment may include a PDSCH scheduling assignment associated with a PDSCH communication, and the wireless communication device may determine a first PUSCH scheduling assignment, associated with a first PUSCH communication, and a second PUSCH scheduling assignment, associated with a second PUSCH communication, based at least in part on the paired scheduling assignment, in a similar manner to that described above.

As indicated above, FIGS. 6A and 6B are provided as examples. Other examples are possible and may differ from what was described with respect to FIGS. 6A and 6B.

Figure 7:
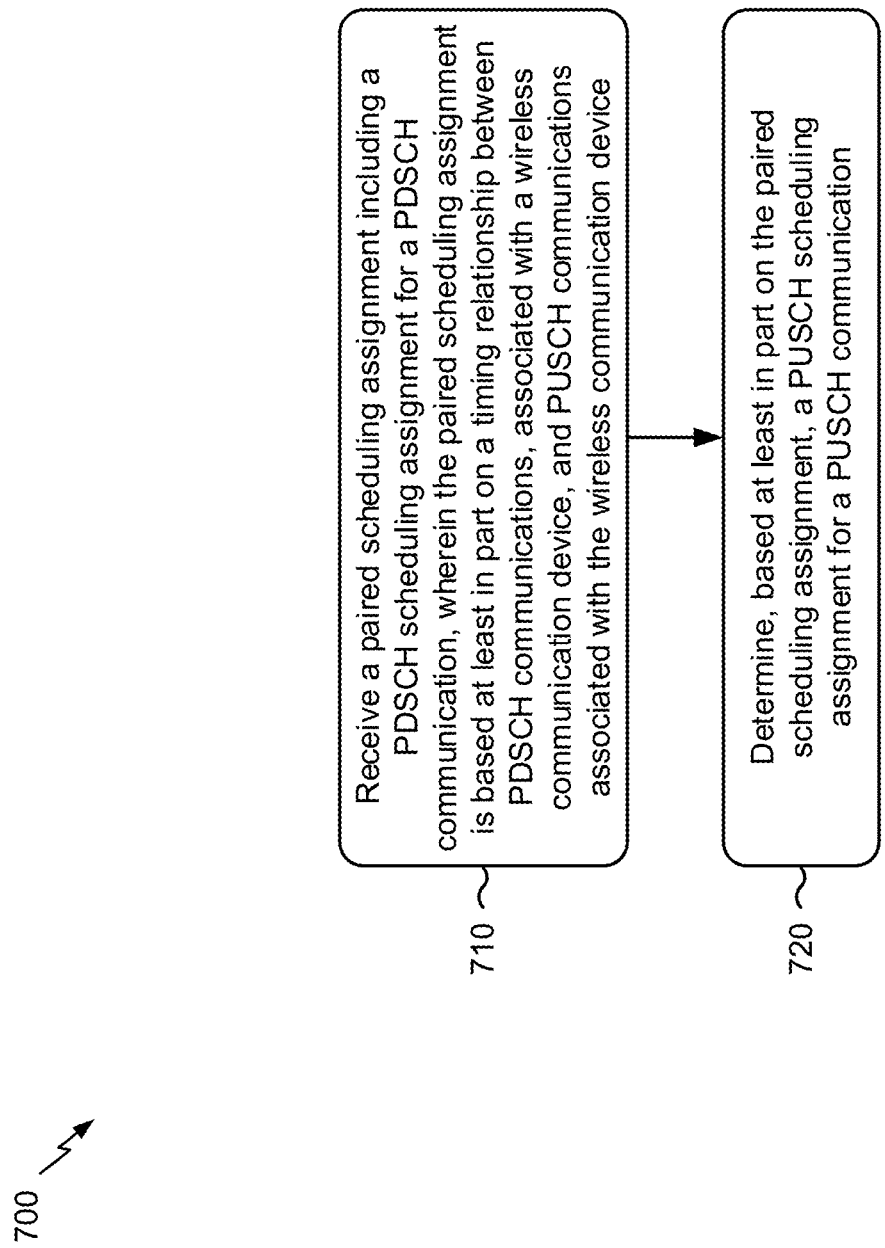
FIG. 7 is a diagram illustrating an example process performed, for example, by a wireless communication device, in accordance with various aspects of the present disclosure.

FIG. 7 is a diagram illustrating an example process 700 performed, for example, by a wireless communication device, in accordance with various aspects of the present disclosure. Example process 700 is an example where a wireless communication device (e.g., BS 110, UE 120, and/or the like) performs operations associated with paired PDSCH and PUSCH scheduling.

As shown in FIG. 7, in some aspects, process 700 may include receiving a paired scheduling assignment including a PDSCH scheduling assignment for a PDSCH communication, wherein the paired scheduling assignment is based at least in part on a timing relationship between PDSCH communications, associated with the wireless communication device, and PUSCH communications associated with the wireless communication device (block 710). For example, the wireless communication device (e.g., UE 120, S/A 520, using receive processor 258, controller/processors 280, and/or the like) may receive a paired scheduling assignment including a PDSCH scheduling assignment for a PDSCH communication, as described above. In some aspects, the paired scheduling assignment is based at least in part on a timing relationship between PDSCH communications, associated with the wireless communication device, and PUSCH communications associated with the wireless communication device.

As shown in FIG. 7, in some aspects, process 700 may include determining, based at least in part on the paired scheduling assignment, a PUSCH scheduling assignment for a PUSCH communication (block 720). For example, the wireless communication device (e.g., UE 120, S/A 520, using receive processor 258, control/processor 280) may determine, based at least in part on the paired scheduling assignment, a PUSCH scheduling assignment for a PUSCH communication, as described above.

Process 700 may include additional aspects, such as any single aspect or any combination of aspects described below and/or in connection with one or more other processes described elsewhere herein.

In some aspects, the PUSCH scheduling assignment is determined based at least in part on the PUSCH scheduling assignment being included in the paired scheduling assignment. In some aspects, the PDSCH scheduling assignment and the PUSCH scheduling assignment share a set of cyclic redundancy check (CRC) bits included in the paired scheduling assignment.

In some aspects, the paired scheduling assignment is received in a physical downlink control channel (PDCCH).

In some aspects, the PUSCH scheduling assignment is determined based at least in part on a timing offset associated with the PDSCH scheduling assignment. In some aspects, the timing offset is configured on the wireless communication device via radio resource control (RRC) signaling. In some aspects, information indicative of the timing relationship between the PDSCH communications and the PUSCH communications is communicated prior to the RRC signaling.

In some aspects, the PUSCH scheduling assignment is determined based at least in part on the PDSCH scheduling assignment and a predetermined relationship associated with the PDSCH scheduling assignment.

In some aspects, the PUSCH scheduling assignment is determined based at least in part on identifying a set of uplink resources, associated with the PUSCH scheduling assignment, based at least in part on a set of downlink resources identified by the PDSCH scheduling assignment. In some aspects, the set of uplink resources is one of plurality of sets of uplink resources, wherein information associating the set of downlink resources and the plurality of sets of uplink resources is configured on the wireless communication device via radio resource control (RRC) signaling.

In some aspects, the PUSCH scheduling assignment is determined based at least in part on identifying a modulation and coding scheme (MCS), associated with the PUSCH communication, based at least in part on a MCS associated with the PDSCH scheduling assignment. In some aspects, information associating the MCS, associated with the PUSCH communication, and the MCS, associated with the PDSCH communication, is configured on the wireless communication device via radio resource control (RRC) signaling.

In some aspects, the PDSCH scheduling assignment is a first PDSCH scheduling assignment and the PDSCH communication is a first PDSCH communication, and a second PDSCH scheduling assignment, associated with a second PDSCH communication, is determined based at least in part on the paired scheduling assignment.

In some aspects, the PUSCH scheduling assignment is a first PUSCH scheduling assignment and the PUSCH communication is a first PUSCH communication, and a second PUSCH scheduling assignment, associated with a second PUSCH communication, is determined based at least in part on the paired scheduling assignment.

In some aspects, the PDSCH communication is received based at least in part on the PDSCH scheduling assignment. In some aspects, the PUSCH communication is transmitted based at least in part on the PUSCH scheduling assignment.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
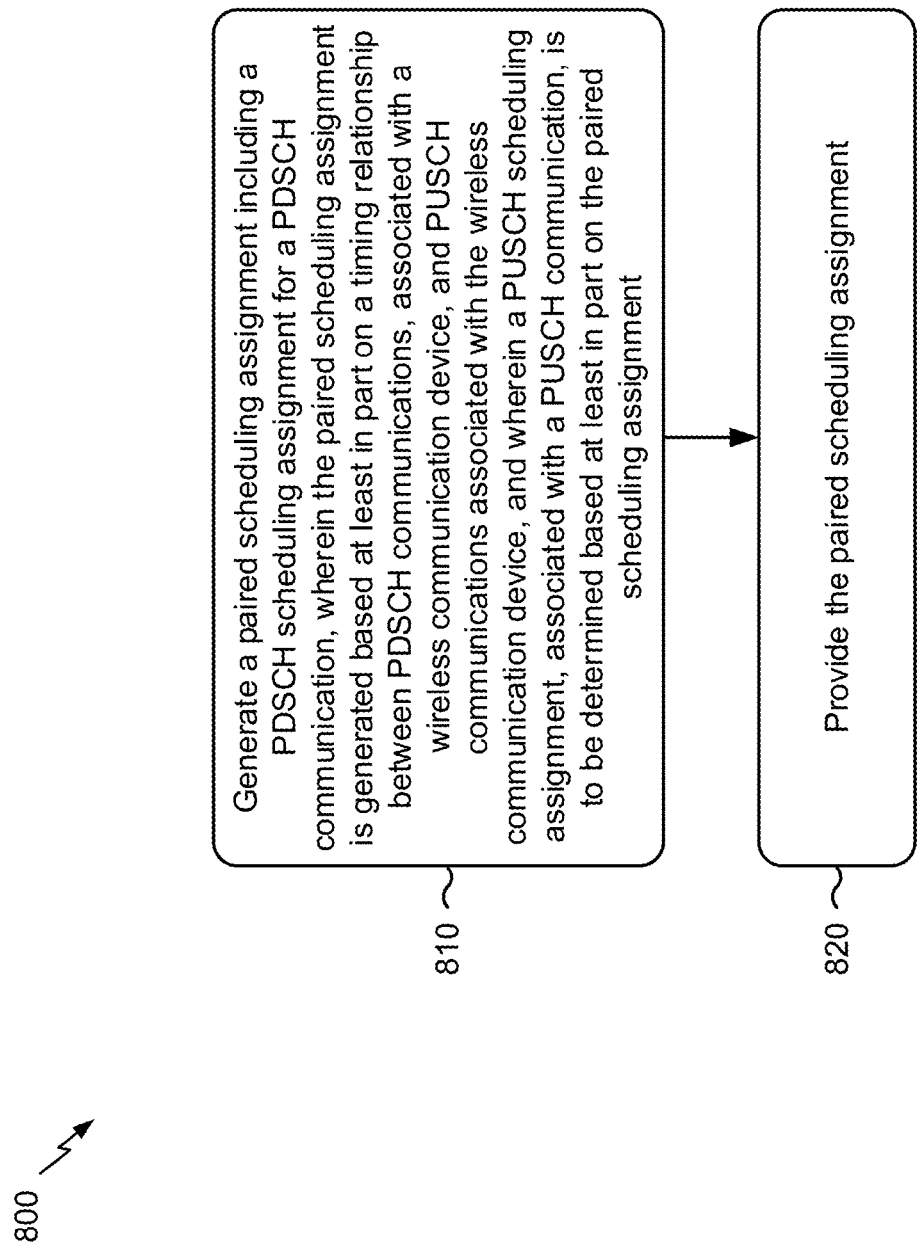
FIG. 8 is a diagram illustrating an example process performed, for example, by a wireless communication device, in accordance with various aspects of the present disclosure.

FIG. 8 is a diagram illustrating an example process 800 performed, for example, by a wireless communication device, in accordance with various aspects of the present disclosure. Example process 800 is an example where a wireless communication device (e.g., BS 110, UE 120, and/or the like) performs operations associated with paired PDSCH and PUSCH scheduling.

As shown in FIG. 8, in some aspects, process 800 may generate a paired scheduling assignment including a PDSCH scheduling assignment for a PDSCH communication, wherein the paired scheduling assignment is based at least in part on a timing relationship between PDSCH communications, associated with the wireless communication device, and PUSCH communications associated with the wireless communication device, and wherein a PUSCH scheduling assignment, associated with a PUSCH communication, is to be determined based at least in part on the paired scheduling assignment (block 810). For example, the wireless communication device (e.g., base station 110, PLC 515, using transmit processor 220, controller/processor 240, and/or the like) may generate a paired scheduling assignment including a PDSCH scheduling assignment for a PDSCH communication, wherein the paired scheduling assignment is based at least in part on a timing relationship between PDSCH communications, associated with the wireless communication device, and PUSCH communications associated with the wireless communication device, and wherein a PUSCH scheduling assignment, associated with a PUSCH communication, is to be determined based at least in part on the paired scheduling assignment, as described above.

As shown in FIG. 8, in some aspects, process 800 may include providing the paired scheduling assignment (block 820). For example, the wireless communication device (e.g., base station 110, PLC 515, using transmit processor 220, controller/processor 240, antenna 234, and/or the like) may provide the paired scheduling assignment, as described above.

Process 800 may include additional aspects, such as any single aspect or any combination of aspects described below and/or in connection with one or more other processes described elsewhere herein.

In some aspects, information indicative of the timing relationship between the PDSCH communications and the PUSCH communications is received from another wireless communication device prior to generating the paired scheduling assignment.

In some aspects, information indicative of the timing relationship between the PDSCH communications and the PUSCH communications is determined by the wireless communication device.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

The foregoing disclosure provides illustration and description, but is not intended to be exhaustive or to limit the aspects to the precise form disclosed. Modifications and variations are possible in light of the above disclosure or may be acquired from practice of the aspects.

As used herein, the term component is intended to be broadly construed as hardware, firmware, or a combination of hardware and software. As used herein, a processor is implemented in hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods, described herein, may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of possible aspects. In fact, many of these features may be combined in ways not specifically recited in the claims and/or disclosed in the specification. Although each dependent claim listed below may directly depend on only one claim, the disclosure of possible aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a wireless communication device, comprising:
   receiving a paired scheduling assignment including a physical downlink shared channel (PDSCH) scheduling assignment for a PDSCH communication,
      wherein the paired scheduling assignment is based at least in part on a timing relationship between PDSCH communications, associated with the wireless communication device, and physical uplink shared channel (PUSCH) communications associated with the wireless communication device, and
      wherein the timing relationship indicates that the wireless communication device transmits a PUSCH communication a particular amount of time after the wireless communication device receives a PDSCH communication;
   determining, based at least in part on the paired scheduling assignment and information associating a PDSCH modulation and coding scheme (MCS) and a PUSCH MCS, a PUSCH scheduling assignment for a PUSCH communication,
      wherein the information associating the PDSCH MCS and the PUSCH MCS indicates that the PUSCH communication is to use a same modulation scheme as the PDSCH communication, and
      wherein the information associating the PDSCH MCS and the PUSCH MCS indicates a PUSCH coding rate is one of a set of coding rates based on a PDSCH coding rate; and
   communicating the PDSCH communication and PUSCH communication based on the PDSCH scheduling assignment and the PUSCH scheduling assignment.

2. The method of claim 1, wherein another PUSCH scheduling assignment is determined based at least in part on the other PUSCH scheduling assignment being included in another paired scheduling assignment that includes another PDSCH scheduling assignment.

3. The method of claim 2, wherein the other PDSCH scheduling assignment and the other PUSCH scheduling assignment share a set of cyclic redundancy check (CRC) bits included in the other paired scheduling assignment.

4. The method of claim 1, wherein the paired scheduling assignment is received in a physical downlink control channel (PDCCH).

5. The method of claim 1, wherein the timing offset is configured on the wireless communication device via radio resource control (RRC) signaling.

6. The method of claim 5, wherein information indicative of the timing relationship between the PDSCH communications and the PUSCH communications is communicated prior to the RRC signaling.

7. The method of claim 1, wherein the PUSCH scheduling assignment is determined based at least in part on the PDSCH scheduling assignment and a predetermined relationship associated with the PDSCH scheduling assignment.

8. The method of claim 1, wherein the PUSCH scheduling assignment is determined based at least in part on identifying a set of uplink resources, associated with the PUSCH scheduling assignment, based at least in part on a set of downlink resources identified by the PDSCH scheduling assignment.

9. The method of claim 8, wherein the set of uplink resources is one of plurality of sets of uplink resources,
   wherein information associating the set of downlink resources and the plurality of sets of uplink resources is configured on the wireless communication device via radio resource control (RRC) signaling.

10. The method of claim 1, wherein the PUSCH scheduling assignment is determined based at least in part on identifying the PUSCH MCS based at least in part on the PDSCH MCS associated with the PDSCH scheduling assignment and the information associating the PDSCH MCS and the PUSCH MCS.

11. The method of claim 1, wherein the information associating the PDSCH MCS and the PUSCH MCS is configured on the wireless communication device via radio resource control (RRC) signaling.

12. The method of claim 1, wherein the PDSCH scheduling assignment is a first PDSCH scheduling assignment and the PDSCH communication is a first PDSCH communication, and
wherein a second PDSCH scheduling assignment, associated with a second PDSCH communication, is determined based at least in part on the paired scheduling assignment.

13. The method of claim 1, wherein the PUSCH scheduling assignment is a first PUSCH scheduling assignment and the PUSCH communication is a first PUSCH communication,
wherein a second PUSCH scheduling assignment, associated with a second PUSCH communication, is determined based at least in part on the paired scheduling assignment.

14. The method of claim 1, wherein the PDSCH communication is received based at least in part on the PDSCH scheduling assignment.

15. The method of claim 1, wherein the PUSCH communication is transmitted based at least in part on the PUSCH scheduling assignment.

16. A wireless communication device for wireless communication, comprising:
a memory; and
one or more processors operatively coupled to the memory, the memory and the one or more processors configured to:
receive a paired scheduling assignment including a physical downlink shared channel (PDSCH) scheduling assignment for a PDSCH communication,
wherein the paired scheduling assignment is based at least in part on a timing relationship between PDSCH communications, associated with the wireless communication device, and physical uplink shared channel (PUSCH) communications associated with the wireless communication device, and
wherein the timing relationship indicates that the wireless communication device transmits a PUSCH communication a particular amount of time after the wireless communication device receives a PDSCH communication;
determine, based at least in part on the paired scheduling assignment and information associating a PDSCH modulation and coding scheme (MCS) and a PUSCH MCS, a PUSCH scheduling assignment for a PUSCH communication,
wherein the information associating the PDSCH MCS and the PUSCH MCS indicates that the PUSCH communication is to use a same modulation scheme as the PDSCH communication, and
wherein the information associating the PDSCH MCS and the PUSCH MCS indicates a PUSCH coding rate is one of a set of coding rates based on a PDSCH coding rate; and
communicate the PDSCH communication and PUSCH communication based on the PDSCH scheduling assignment and the PUSCH scheduling assignment.

17. The wireless communication device of claim 16, wherein another PUSCH scheduling assignment is determined based at least in part on the other PUSCH scheduling assignment being included in another paired scheduling assignment that includes another PDSCH scheduling assignment.

18. The wireless communication device of claim 17, wherein the other PDSCH scheduling assignment and the other PUSCH scheduling assignment share a set of cyclic redundancy check (CRC) bits included in the other paired scheduling assignment.

19. The wireless communication device of claim 16, wherein the PUSCH scheduling assignment is determined based at least in part on the PDSCH scheduling assignment and a predetermined relationship associated with the PDSCH scheduling assignment.

20. The wireless communication device of claim 16, wherein the PUSCH scheduling assignment is determined based at least in part on identifying a set of uplink resources, associated with the PUSCH scheduling assignment, based at least in part on a set of downlink resources identified by the PDSCH scheduling assignment.

21. The wireless communication device of claim 16, wherein the PUSCH scheduling assignment is determined based at least in part on identifying the PUSCH MCS based at least in part on the PDSCH MCS associated with the PDSCH scheduling assignment and the information associating the PDSCH MCS and the PUSCH MCS.

22. A non-transitory computer-readable medium storing instructions for wireless communication, the instructions comprising:
one or more instructions that, when executed by one or more processors of a wireless communication device, cause the one or more processors to:
receive a paired scheduling assignment including a physical downlink shared channel (PDSCH) scheduling assignment for a PDSCH communication,
wherein the paired scheduling assignment is based at least in part on a timing relationship between PDSCH communications, associated with the wireless communication device, and physical uplink shared channel (PUSCH) communications associated with the wireless communication device, and
wherein the timing relationship indicates that the wireless communication device transmits a PUSCH communication a particular amount of time after the wireless communication device receives a PDSCH communication;
determine, based at least in part on the paired scheduling assignment and information associating a PDSCH modulation and coding scheme (MCS) and a PUSCH MCS, a PUSCH scheduling assignment for a PUSCH communication,
wherein the information associating the PDSCH MCS and the PUSCH MCS indicates that the PUSCH communication is to use a same modulation scheme as the PDSCH communication, and
wherein the information associating the PDSCH MCS and the PUSCH MCS indicates a PUSCH coding rate is one of a set of coding rates based on a PDSCH coding rate; and
communicate the PDSCH communication and PUSCH communication based on the PDSCH scheduling assignment and the PUSCH scheduling assignment.

23. The non-transitory computer-readable medium of claim 22, wherein another PUSCH scheduling assignment is determined based at least in part on the other PUSCH scheduling assignment being included in another paired scheduling assignment that includes another PDSCH scheduling assignment.

24. The non-transitory computer-readable medium of claim 22, wherein the PUSCH scheduling assignment is determined based at least in part on the PDSCH scheduling assignment and a predetermined relationship associated with the PDSCH scheduling assignment.

25. A method of wireless communication performed by a wireless communication device, comprising:
  generating a paired scheduling assignment including a physical downlink shared channel (PDSCH) scheduling assignment for a PDSCH communication,
    wherein the paired scheduling assignment is generated based at least in part on a timing relationship between PDSCH communications, associated with the wireless communication device, and physical uplink shared channel (PUSCH) communications associated with the wireless communication device,
    wherein the timing relationship indicates that the wireless communication device transmits a PUSCH communication a particular amount of time after the wireless communication device receives a PDSCH communication, and
    wherein a PUSCH scheduling assignment, associated with a PUSCH communication, is to be determined based at least in part on the paired scheduling assignment and information associating a PDSCH modulation and coding scheme (MCS) and a PUSCH MCS,
      wherein the information associating the PDSCH MCS and the PUSCH MCS indicates that the PUSCH communication is to use a same modulation scheme as the PDSCH communication, and
      wherein the information associating the PDSCH MCS and the PUSCH MCS indicates a PUSCH coding rate is one of a set of coding rates based on a PDSCH coding rate; and
  providing the paired scheduling assignment.

26. The method of claim 25, wherein information indicative of the timing relationship between the PDSCH communications and the PUSCH communications is received from another wireless communication device prior to generating the paired scheduling assignment.

27. The method of claim 25, wherein information indicative of the timing relationship between the PDSCH communications and the PUSCH communications is determined by the wireless communication device.

28. The method of claim 25, wherein the timing offset is configured on the wireless communication device via radio resource control (RRC) signaling.

29. The method of claim 28, wherein information indicative of the timing relationship between the PDSCH communications and the PUSCH communications is communicated prior to the RRC signaling.

30. The method of claim 25, wherein the PDSCH scheduling assignment is a first PDSCH scheduling assignment and the PDSCH communication is a first PDSCH communication, and
  wherein a second PDSCH scheduling assignment, associated with a second PDSCH communication, is to be determined based at least in part on the paired scheduling assignment.

* * * * *